United States Patent [19]

Uchiumi

[11] Patent Number: 5,406,452
[45] Date of Patent: Apr. 11, 1995

[54] DOUBLE TYPE MOUNT STRUCTURE FOR MOUNTING ELECTRONIC CIRCUIT PACKAGE

[75] Inventor: Hiroshi Uchiumi, Kawasaki, Japan
[73] Assignee: Fujitsu Limited, Kanagawa, Japan
[21] Appl. No.: 29,465
[22] Filed: Mar. 11, 1993

[30] Foreign Application Priority Data

Mar. 11, 1992 [JP] Japan .................. 4-052411

[51] Int. Cl.6 ............................... H05K 7/16
[52] U.S. Cl. ...................... 361/727; 361/610
[58] Field of Search ............ 211/26, 41; 312/223, 312/308, 330; 361/796–797, 608, 610, 724–727, 744, 735, 792, 797–798, 801–802, 807, 809–810, 826, 829; 379/325–328

[56] References Cited

U.S. PATENT DOCUMENTS

| | | | |
|---|---|---|---|
| 2,994,807 | 8/1961 | Devine et al. | 361/727 |
| 3,001,102 | 9/1961 | Stietel et al. | 361/724 |
| 3,131,330 | 4/1964 | Allen | 361/726 |
| 3,184,645 | 5/1965 | Schaetter | 361/724 |
| 3,188,524 | 6/1965 | Williams | 361/724 |
| 4,272,141 | 6/1981 | McKeen et al. | 361/796 |

FOREIGN PATENT DOCUMENTS

| | | | |
|---|---|---|---|
| 1128897 | 5/1962 | Germany | 361/796 |
| 2196499 | 8/1993 | Japan . | |
| 1004011 | 9/1965 | United Kingdom | 361/796 |

Primary Examiner—Gregory D. Thompson

[57] ABSTRACT

A double mount type structure for mounting a plurality of electronic circuit packages, including a box-shaped shelf, front and rear sub units accommodated in the shelf and having front and rear back wiring boards, respectively, each having connectors through which a plurality of the packages can be mounted on the back wiring board. The rear wiring board is fixed to the shelf and, on the other hand, the front wiring board is movable between a closed position and an opened position thereof, so that, when the front back wiring board is in the opened position, the rear sub unit is accessible and, therefore, the packages can easily be loaded on and unloaded from the rear sub unit.

6 Claims, 5 Drawing Sheets

DOUBLE TYPE MOUNT STRUCTURE FOR MOUNTING ELECTRONIC CIRCUIT PACKAGE

BACKGROUND OF THE INVENTION

1. Field of the Invention

This invention relates to a mount structure for electronic circuit packages, and more particularly, to a double type mount structure for mounting thereon a large number of such packages.

2. Description of the Related Art

Generally, a box-shaped shelf used for an electronic switching apparatus is opened at the front thereof, so that the electronic circuit packages can be loaded on and unloaded from the shelf through the front opening.

Recently, to improve the mounting capacity for these electronic circuit packages, it has been proposed that the shelf is divided to two sub-units, i.e., a front unit and a rear unit.

However, in case of dividing one shelf to a front unit and a rear unit for mounting the electronic circuit packages, when the packages in the back unit are to be unloaded from the shelf, the packages in the front unit must be removed in advance from the shelf, as well as an upright back wiring board of the front unit for supporting the electronic circuit packages in the shelf must also be removed so as to open the passage, through which the packages in the rear unit are unloaded, which is very troublesome and requires a lot of time.

SUMMARY OF THE INVENTION

An object of the present invention is to provide a double type mount structure for mounting thereon electronic circuit packages, in which a front sub unit can easily be retracted temporally, so that the electronic circuit packages can easily and quickly be loaded on or unloaded from the rear sub-unit.

According to the present invention, there is provided a double type mount structure for mounting thereon a plurality of electronic circuit packages, comprising: a box-shaped shelf; front and rear sub units accommodated in said shelf and comprising front and rear back wiring boards, respectively, each having connectors through which a plurality of said packages can be mounted on the back wiring board; means for fixing said rear wiring board in its vertical state to said shelf; and guide means for supporting said front wiring board movably between its vertical closed position and its horizontal opened position thereof, so that, when said front back wiring board is in the horizontal opened position, said rear sub unit is accessible and, therefore, the packages can easily be loaded on and unloaded from said rear sub unit.

DESCRIPTION OF THE PREFERRED EMBODIMENTS

Figure 1:
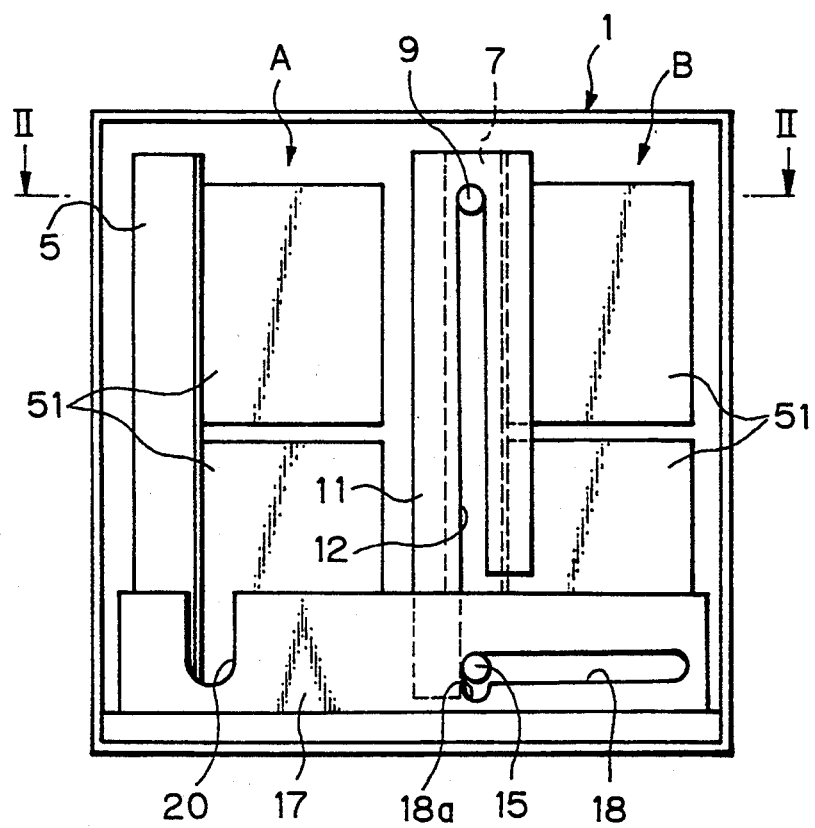
FIG. 1 is a side elevational view of a first embodiment of a double type mount structure for mounting electronic circuit packages according to the present invention and illustrating also the inside thereof.
Figure 2:
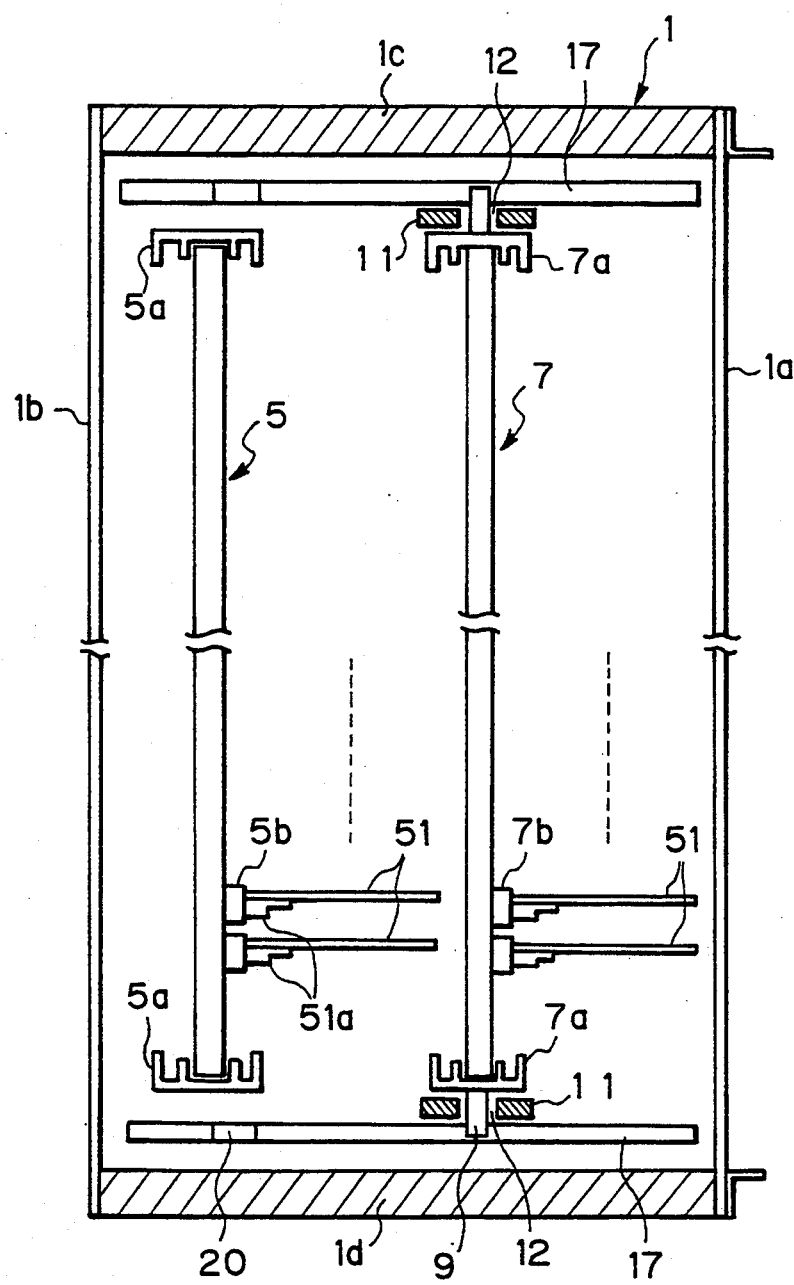
FIG. 2 is a cross-sectional view taken along line II—II in FIG. 1.

Referring now to the drawings, wherein FIGS. 1, 2, and 3A–3C illustrate the first embodiment of a double type mount structure for mounting electronic circuit packages according to the present invention.

In the first embodiment, the reference numeral 1 generally denotes a box-shaped shelf used for, for example an electronic switching apparatus, which comprises a front panel 1a, a back panel 1b, and left and right side panels 1c and 1d. When the front panel 1a is removed or opened, one can access the interior of the shelf.

To improve the mounting capacity for electronic circuit packages 51, the interior of the shelf 1 is divided in to two sub units, i.e., a rear sub unit A (left side in the drawings) and a front sub unit B (right side in the drawings).

In the shelf 1, back wiring boards (BWB) 5 and 7 are secured to respective side frames 5a and 7a in such a manner that the BWBs 5 and 7 are spaced from each other and vertically positioned. The side frames 5a of the BWB 5 of the rear sub unit A are completely fixed to the shelf 1 by means of bolts or the like (not shown) and, on the other hand, the side frames 7a of the BWB 7 of the front sub unit B are movably supported on the shelf 1, as described later in detail.

As will be known, each of the BWBs 5 and 7 comprises by itself a printed board having a plurality of connectors 5b, 7b and each of electronic circuit packages 51, having a size of, such as 40 mm×60 mm, also comprises by itself a printed board having a connector 51a, so that the package 51 can be loaded and supported by engaging the connector 51a of the package 51 with the connector 5b, 7b of the BWB 5, 7. These packages 51 are arranged horizontally in 42 rows having a pitch of 15 to 16 mm and 4 to 5 vertical stages.

In the front sub unit B, the left and right side frames 7a of the front BWB 7 are provided at the upper end thereof, at the vertical position, with respective first projections 9 each comprising a rod pin. These first projections 9 are engaged with vertical long grooves 12 having U-shaped guide plates 11 that are fixed to the inside of the left and right side panels 1c and 1d, respectively.

The left and right side frames 7a of the front BWB 7 are also provided at the lower end thereof, at the vertical position, with second projections 15, respectively, each also comprising a rod pin. These second projections 15 are engaged with horizontal elongated grooves 18 of slide bases 17 that are slidingly supported on the left and right bottom portions of the shelf 1, respectively, in such a manner that the slide bases 17 can be slidingly moved forward and backward along left and right rails using any well known method.

Each groove 18 is provided with, at its rear end, a downward recess 18a with which the lower projection 15 is engaged, so that the front BWB is held in the vertical position, as shown in FIG. 1. In this case, the slide bases 17 are also held in the retracted position as shown in FIG. 1 by any known stopper means, not illustrated in the drawings.

Figure 3A:
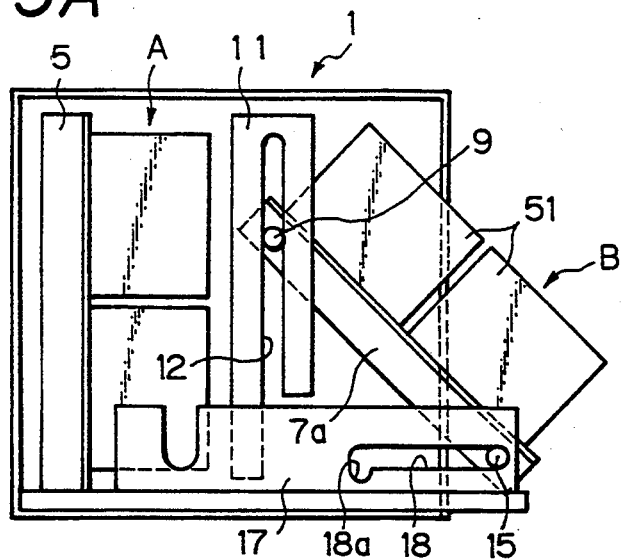
FIGS. 3A–3C show a typical operation of the first embodiment.

The operation of the above mentioned first embodiment will now be described with reference to FIGS. 3A–3C.

When the front sub unit B is to be opened, the lower portions of the BWB side frames 7a are first drawn forward with respect to the shelf 1, so that the lower projections 15 are moved out of the recesses 18a. Thus, the upper portions (upper projections 9) of the BWB side frames 7a are guided downward along the vertical grooves 12 of the respective guide plates 11 and also the lower portions (lower projections 15) of the BWB side frames 7a are guided forward along the horizontal elongated grooves 18 of the respective slide bases 17, so that the front sub unit B of BWB 7 turns, as shown in FIG. 3A. After the lower projections 15 reach the other ends of the horizontal grooves 18, the slide bases 17 are also moved forward.

Then, the left and right upper projections 9 of the BWB side frames 7a come out of the vertical grooves 12 of the guide plates 11 and go into the U-shaped recesses 20, respectively. Thus, the front sub unit B turns about 90° so as to be in a horizontal position and completely supported on the slide bases 17, as shown in FIG. 3B.

Figure 3B:
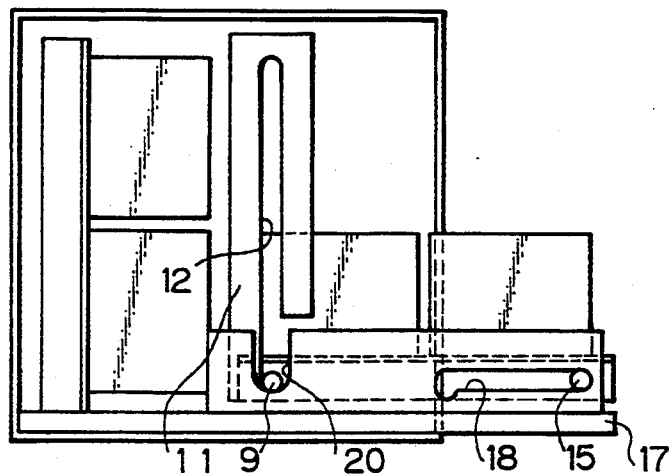
Figure 3C:
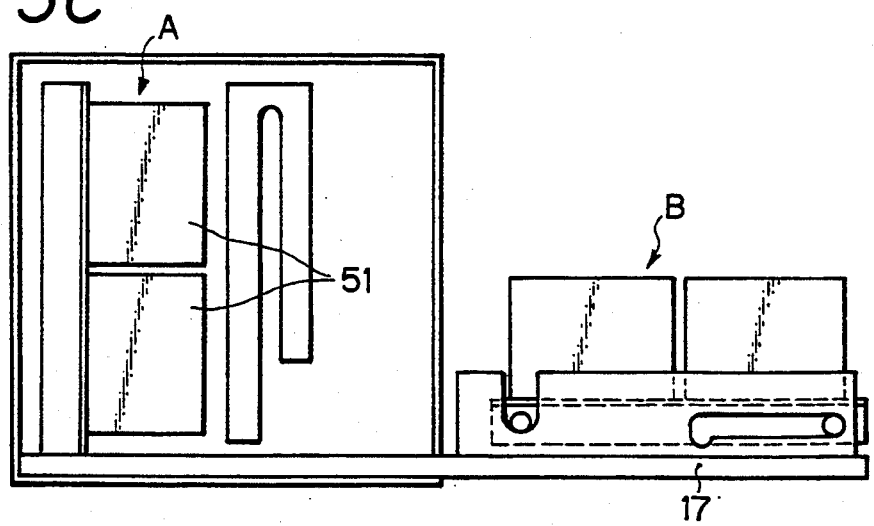
Figure 4:
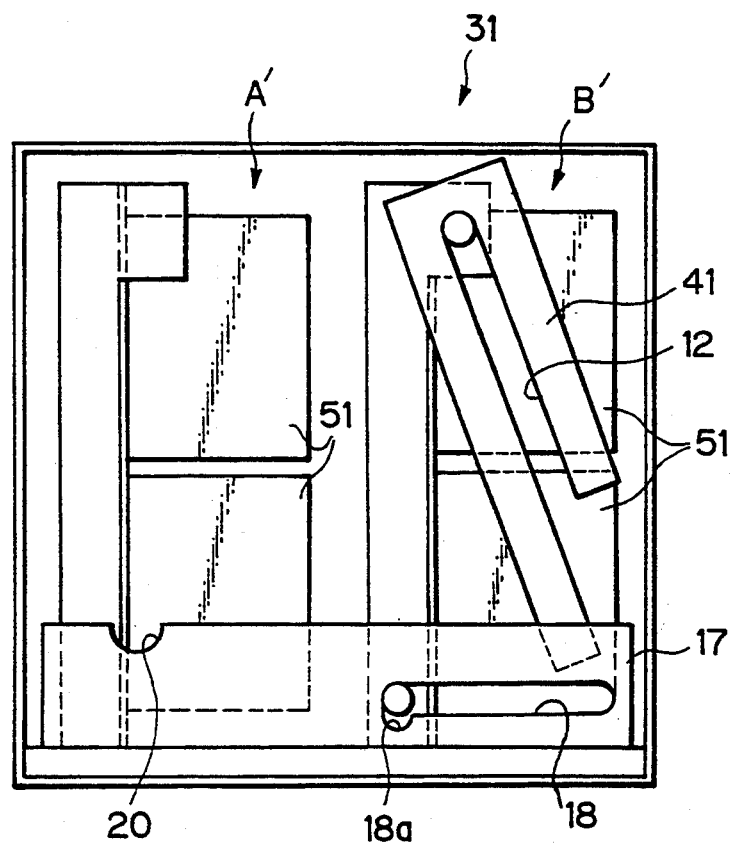
FIG. 4 is a side elevational view of a second embodiment similar to FIG. 1.

The front BWB sub unit B is further drawn forward with the slide bases 17 so as to be out of the shelf 1, as shown in FIG. 3C. In this position, a front space necessary for accessing the rear sub unit A is enough, so that the electronic circuit packages 51 can easily and quickly be loaded on and unloaded from the rear sub unit A.

In contrast, when the front sub unit B is to be closed, the front BWB sub unit B is first pushed back with the slide bases 17 until the projections 9 of the BWB side frames 7a come into contact with the vertical grooves 12 of the guide plates 11 (FIG. 3B). Then, the front BWB sub unit B is raised and further pushed back, so that the front sub unit B turns about 90° in such a manner that the upper projections 9 are guided upward along the vertical grooves 12 and the lower projections 15 are guided rearward along the horizontal grooves 18 so as to be in a vertical position. Finally, the lower projections 15 go into the recesses 18a of the slide bases 17 (FIG. 3A) which are also retained by any stopper means, not shown, as described above.

Referring now to FIG. 4, and FIGS. 5A–5C illustrating the second embodiment of a double type mount structure for mounting electronic circuit packages according to the present invention.

In the second embodiment, since the same or corresponding parts as those in the first embodiment are indicated by the same reference numerals, explanations of said parts are omitted.

In the first embodiment, when the front sub unit B is drawn forward, it abruptly turns about 90° from its vertical position to a horizontal position and the upper projections 9 collide with the recesses 18a. Also, when the upper projections 9 collide with the recesses 18a, a noise is generated.

The second embodiment is provided to prevent the problem of the first embodiment as described above. In this embodiment, the shelf 31 comprises left and right U-shaped guide plates 41 that are inclined in such a manner that the lower portions thereof are directed forward.

Figure 5A:
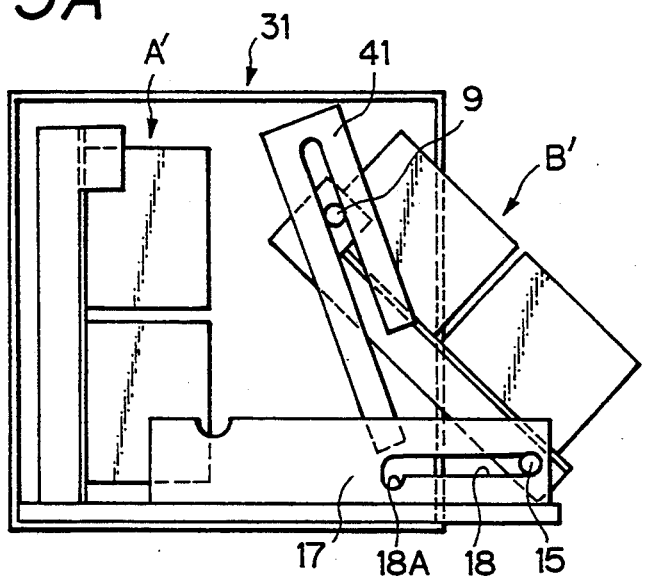
FIGS. 5A–5C show an operation of the second embodiment similar to FIGS. 3A–3C.

When the front sub unit B' is to be opened, the lower portion of the sub unit B' is first drawn forward with respect to the shelf 1, so that the lower projections 15 are moved out of the recesses 18a, in the same manner as the first embodiment. Thus, the upper portions (upper projections 9) of the sub unit B' are guided along the inclined grooves 12 of the respective guide plates 41 and also the lower portions (lower projections 15) of the sub unit B' are guided along the horizontal elongated grooves 18 of the respective slide bases 17, so that the sub unit B' turns, as shown in FIG. 5A.

Figure 5B:
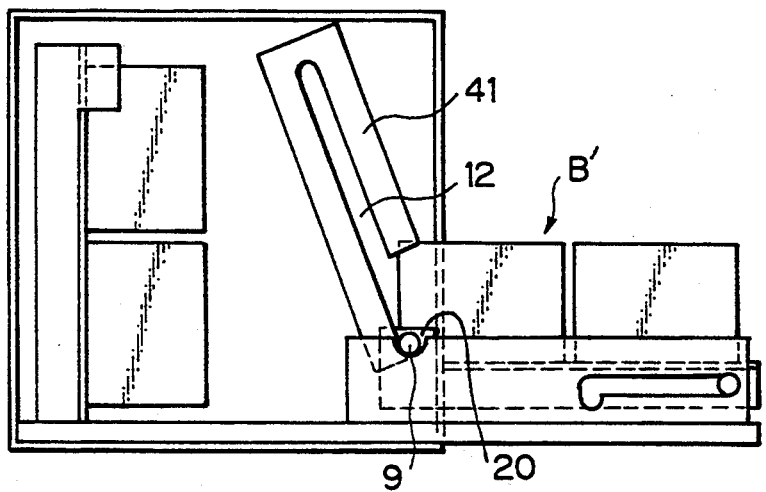

Then, the left and right upper projections 9 of the sub unit B' come out of the inclined grooves 12 of the guide plates 41 and go into the U-shaped recesses 20, respectively, as shown in FIG. 5B.

Figure 5C:
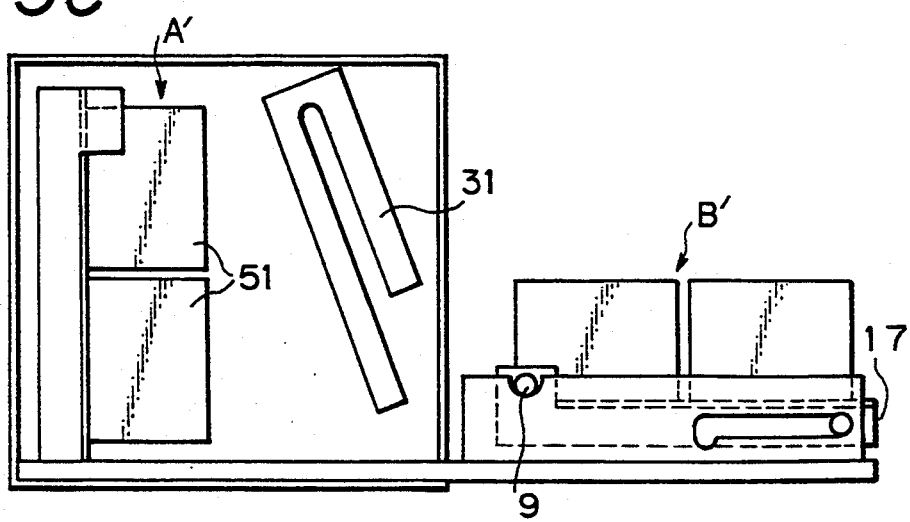

In the second embodiment, when the front sub unit B' is to be closed, the front sub unit B' is first pushed back with the slide bases 17, as shown in FIG. 5C, in the same manner as the first embodiment. After the projections 9 coming into contact with the inclined grooves 12 of the guide plates 41 (FIG. 5B), the front sub unit B' is automatically raised, so that the front sub unit B' turns about 90° in such a manner that the upper projections 9 are guided up along the inclined grooves 12 and the lower projections 15 are guided along the horizontal grooves 18 so as to be in a vertical position. Finally, the lower projections 15 go into the recesses 18a of the slide bases 17 (FIG. 5A) which are also retained by any stopper means, not shown, as described above, in the same manner as the first embodiment.

As mentioned above, in the second embodiment, the turning of the front sub unit B' can be very smoothly and quickly carried out, compared with the first embodiment. Also, the generation of noise does not occur.

It should be understood by those skilled in the art that the foregoing description relates only to a preferred embodiment of the disclosed invention, and that various changes and modifications may be made to the invention without departing from the spirit and scope thereof.

I claim:

1. A double type mount structure for mounting thereon a plurality of electronic circuit packages, comprising:
   a box-shaped shelf;
   front and rear sub units accommodated in said shelf and including front and rear back wiring boards, respectively, each having connectors through which a plurality of said packages can be mounted on the back wiring board;
   means for fixing said rear wiring board in a vertical state to said shelf; and
   guide means for supporting said front wiring board movably between a vertical closed position and a horizontal opened position thereof, when said front back wiring board is in said horizontal opened position, said rear sub unit is accessible, whereby packages can easily be loaded on and unloaded from said rear sub unit,
   said guide means having a pair of guide plates fixed to said shelf and a pair of slide bases horizontally and movably supported on said shelf; said guide plates guiding an upper portion of said front wiring board and said slide bases guiding a lower portion of said front wiring board.

2. A mount structure as set forth in claim 1, wherein said front wiring board is substantially rectangular-shaped and has upper projections transversely protruding at respective upper ends thereof and lower projections transversely protruding at respective lower ends thereof; said guide plates have guide grooves for guiding said upper projections, and said slide bases have horizontal guide grooves for guiding said lower projections, so that said front wiring board turns about 90° between said vertical closed position and its horizontal opened position thereof.

3. A mount structure as set forth in claim 2, wherein said upper projections come out of said guide grooves of said guide plates and engage with recesses of said slide bases at a horizontal position of said front wiring board.

4. A mount structure as set forth in claim 2, wherein said horizontal guide grooves of said slide bases have recesses at their rear ends, with which said lower projections are engaged, so that said front wiring board is held in a vertical position.

5. A mount structure as set forth in claim 2, wherein said guide grooves of said guide plates extend vertically, so that said upper projections are vertically guided.

6. A mount structure as set forth in claim 2, wherein said guide grooves of said guide plates are inclined, so that said upper projections are obliquely guided.

* * * * *